United States Patent
Ausserlechner

(10) Patent No.: US 8,760,149 B2
(45) Date of Patent: Jun. 24, 2014

(54) MAGNETIC FIELD CURRENT SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 493 days.

(21) Appl. No.: 12/756,652

(22) Filed: Apr. 8, 2010

(65) Prior Publication Data

US 2011/0248711 A1   Oct. 13, 2011

(51) Int. Cl.
*G01R 33/07* (2006.01)

(52) U.S. Cl.
USPC ...................................... 324/117 H; 324/251

(58) Field of Classification Search
USPC .............................. 324/117 H, 251
See application file for complete search history.

(56) References Cited

U.S. PATENT DOCUMENTS

| | | | |
|---|---|---|---|
| 3,323,057 A | 5/1967 | Mary | |
| 4,894,610 A * | 1/1990 | Friedl | 324/127 |
| 5,017,804 A | 5/1991 | Harnden | |
| 5,041,780 A * | 8/1991 | Rippel | 324/117 H |
| 5,173,758 A * | 12/1992 | Heremans | 257/188 |
| 5,786,976 A | 7/1998 | Field | |
| 5,963,028 A | 10/1999 | Engel | |
| 6,310,470 B1 | 10/2001 | Hebing | |
| 6,341,416 B1 | 1/2002 | Biskeborn | |
| 6,356,068 B1 * | 3/2002 | Steiner et al. | 324/117 H |
| 6,424,018 B1 | 7/2002 | Ohtsuka | |
| 6,452,413 B1 | 9/2002 | Burghartz | |
| 6,462,531 B1 | 10/2002 | Ohtsuka | |
| 6,512,359 B1 | 1/2003 | Tamai | |
| 6,683,448 B1 | 1/2004 | Ohtsuka | |
| 6,727,683 B2 | 4/2004 | Goto | |
| 6,781,313 B2 | 8/2004 | Aiken | |
| 6,781,358 B2 | 8/2004 | Goto | |
| 6,841,989 B2 * | 1/2005 | Goto et al. | 324/117 H |
| 6,940,265 B2 | 9/2005 | Hauenstein | |

(Continued)

FOREIGN PATENT DOCUMENTS

| | | |
|---|---|---|
| DE | 19821492 | 11/1999 |
| DE | 10233129 | 2/2003 |

(Continued)

OTHER PUBLICATIONS

Application and File History for U.S. Appl. No. 13/626,456, filed Sep. 25, 2012, Inventor Motz et al., (Continued)

*Primary Examiner* — Richard Isla Rodas
(74) *Attorney, Agent, or Firm* — Patterson Thuente Pedersen, P.A.

(57) ABSTRACT

Current sensors, conductors and methods are disclosed. A magnetic current sensor includes a conductor including a first sheet metal layer having a first thickness and including at least one notch extending inwardly from a first edge of the first sheet metal layer, and a second sheet metal layer having a second thickness less than the first thickness and including at least one notch, the second sheet metal layer being coupled to the first sheet metal layer such that the at least one notch of the first sheet metal layer is generally aligned with the at least one notch of the second sheet metal layer; and an integrated circuit (IC) die including at least one magnetic sensor element and being coupled to the conductor such that the at least one magnetic sensor element is generally aligned with a tip of the at least one notch of the second sheet metal layer.

16 Claims, 22 Drawing Sheets

(56) References Cited

U.S. PATENT DOCUMENTS

| | | | |
|---|---|---|---|
| 6,949,927 B2 | 9/2005 | Goetz | |
| 6,995,315 B2 * | 2/2006 | Sharma et al. | 174/529 |
| 7,075,287 B1 * | 7/2006 | Mangtani et al. | 324/117 H |
| 7,106,233 B2 * | 9/2006 | Schroeder et al. | 341/141 |
| 7,129,691 B2 | 10/2006 | Shibahara | |
| 7,166,807 B2 | 1/2007 | Gagnon | |
| 7,259,545 B2 | 8/2007 | Stauth | |
| 7,358,724 B2 | 4/2008 | Taylor | |
| 7,375,507 B2 | 5/2008 | Racz | |
| 7,474,093 B2 | 1/2009 | Ausserlechner | |
| 7,476,816 B2 | 1/2009 | Doogue | |
| 7,476,953 B2 | 1/2009 | Taylor | |
| 7,492,178 B2 | 2/2009 | Birdenbach | |
| 7,528,593 B2 | 5/2009 | Tanizawa | |
| 7,545,136 B2 | 6/2009 | Racz | |
| 7,564,239 B2 | 7/2009 | Mapps | |
| 7,605,580 B2 | 10/2009 | Strzalkowski | |
| 7,709,754 B2 | 5/2010 | Doogue | |
| 7,746,056 B2 | 6/2010 | Stauth | |
| 7,816,905 B2 * | 10/2010 | Doogue et al. | 324/117 H |
| 7,923,987 B2 | 4/2011 | Ausserlechner | |
| 8,159,254 B2 | 4/2012 | Kaltalioglu | |
| 8,217,643 B2 | 7/2012 | Kuroki | |
| 8,283,742 B2 | 10/2012 | Motz | |
| 2001/0052780 A1 | 12/2001 | Hayat-Dawoodi | |
| 2005/0270013 A1 | 12/2005 | Berkcan | |
| 2005/0270014 A1 | 12/2005 | Zribi | |
| 2006/0076947 A1 | 4/2006 | Berkcan | |
| 2006/0082983 A1 | 4/2006 | Parkhill | |
| 2006/0255797 A1 | 11/2006 | Taylor | |
| 2006/0284613 A1 | 12/2006 | Hastings | |
| 2007/0063690 A1 | 3/2007 | De Wilde | |
| 2007/0170533 A1 | 7/2007 | Doogue | |
| 2007/0290682 A1 | 12/2007 | Oohira | |
| 2008/0035923 A1 | 2/2008 | Tschmelitsch | |
| 2008/0297138 A1 | 12/2008 | Taylor | |
| 2008/0312854 A1 | 12/2008 | Chemin | |
| 2009/0008794 A1 | 1/2009 | Wu | |
| 2009/0026560 A1 | 1/2009 | Wombacher | |
| 2009/0050990 A1 | 2/2009 | Aono | |
| 2009/0058412 A1 | 3/2009 | Taylor | |
| 2009/0128130 A1 | 5/2009 | Stauth | |
| 2009/0152595 A1 | 6/2009 | Kaga | |
| 2009/0294882 A1 | 12/2009 | Sterling | |
| 2009/0295368 A1 | 12/2009 | Doogue | |
| 2009/0322325 A1 | 12/2009 | Ausserlechner | |
| 2010/0045285 A1 | 2/2010 | Ohmore | |
| 2010/0045286 A1 | 2/2010 | Hotz | |
| 2010/0117638 A1 | 5/2010 | Yamashita | |
| 2010/0156394 A1 | 6/2010 | Ausserlechner | |
| 2010/0231198 A1 | 9/2010 | Bose | |
| 2010/0237853 A1 | 9/2010 | Bose | |
| 2011/0062956 A1 | 3/2011 | Edelstein | |
| 2011/0133732 A1 | 6/2011 | Sauber | |
| 2011/0172938 A1 | 7/2011 | Gu | |
| 2011/0204887 A1 | 8/2011 | Ausserlechner | |
| 2011/0234215 A1 | 9/2011 | Ausserlechner | |
| 2011/0248711 A1 | 10/2011 | Ausserlechner | |
| 2011/0298454 A1 | 12/2011 | Ausserlechner | |
| 2011/0304327 A1 | 12/2011 | Ausserlechner | |
| 2012/0049884 A1 | 3/2012 | Kaltalioglu | |
| 2012/0112365 A1 | 5/2012 | Ausserlechner | |
| 2012/0146164 A1 | 6/2012 | Ausserlechner | |
| 2012/0146165 A1 | 6/2012 | Ausserlechner | |
| 2012/0262152 A1 | 10/2012 | Ausserlechner | |

FOREIGN PATENT DOCUMENTS

| | | |
|---|---|---|
| DE | 10231194 | 2/2004 |
| DE | 19946935 | 2/2004 |
| WO | WO 01/23899 | 4/2001 |
| WO | WO 2005/033718 | 4/2005 |
| WO | WO 2008/008140 | 1/2008 |
| WO | WO 2009/088767 | 9/2009 |

OTHER PUBLICATIONS

Steiner et al., "Fully Packaged CMOS Current Monitor Using Lead-On-Chip Technology," *Physical Electronics Laboratory*, pp. 603-608, © 1998.

Lutz et al., "Double-Sided Low-Temperature Joining Technique for Power Cycling Capability at High Temperature," EPE 2005-Dresden, ISBN: 90-75815-08-5.

Schwarzbauer et al., "Novel Large Area Joining Technique for Improved Power Device Performance," *IEEE Transactions on Industry Applications*, vol. 27, No. 1, pp. 93-95, 1991.

Allegro, Allego Hall Effect-Based Current Sensor ICs: Revolutionary, high accuracy, high bandwidth current sensing!, www.allegomicro.com/en/Products/Design/curren_sensors/index.asp, 5 pages, © 2010.

Allegro, *Hall-Effect Sensor IC's: Current Sensor ICs*, 1 page, © 2010.

Allegro, High Bandwidth, Fast Fault Response Current Sensor IC in Thermally Enhanced Package, ACS709-DS, www.microallegro.com, 16 pages, © 2008-2009.

Allegro, *Fully Integrated, Hall Effect-Based Linear Current Sensor IC with 2.1 kVRMS Isolation and a Low-Resistance Current Conductor*, ACS712-DS, Rev. 13, 14 pages, © 2006-2010.

Sandireddy, Sandhya, *IEEE Xplore*, © 2005, *Advanced Wafer Thinning Technologies to Enable Multichip Packages*, pp. 24-27.

Hopkins, Allegro MicroSystems, Inc., High-Performance Power ICs and Hall-Effect Sensors, "Hall Effect Technology for Server, Backplane and Power Supply Applications", IBM 2008 Power and Cooling Symposium, Sep. 30, 2008, 34 pages.

Application and File History for U.S. Appl. No. 12/630,596, filed Dec. 3, 2009, Inventor: Ausserlecher et al.

Application and File History for U.S. Appl. No. 12/711,471, filed Feb. 24, 2010, Inventor: Ausserlecher et al.

Application and File History for U.S. Appl. No. 12/813,218, filed Jun. 10, 2010, Inventor: Ausserlecher.

Application and File History for U.S. Appl. No. 12/872,665, filed Aug. 31, 2010, Inventor: Ausserlecher et al.

Application and File History for U.S. Appl. No. 13/086,566, filed Apr. 14, 2011, Inventor: Ausserlecher.

\* cited by examiner

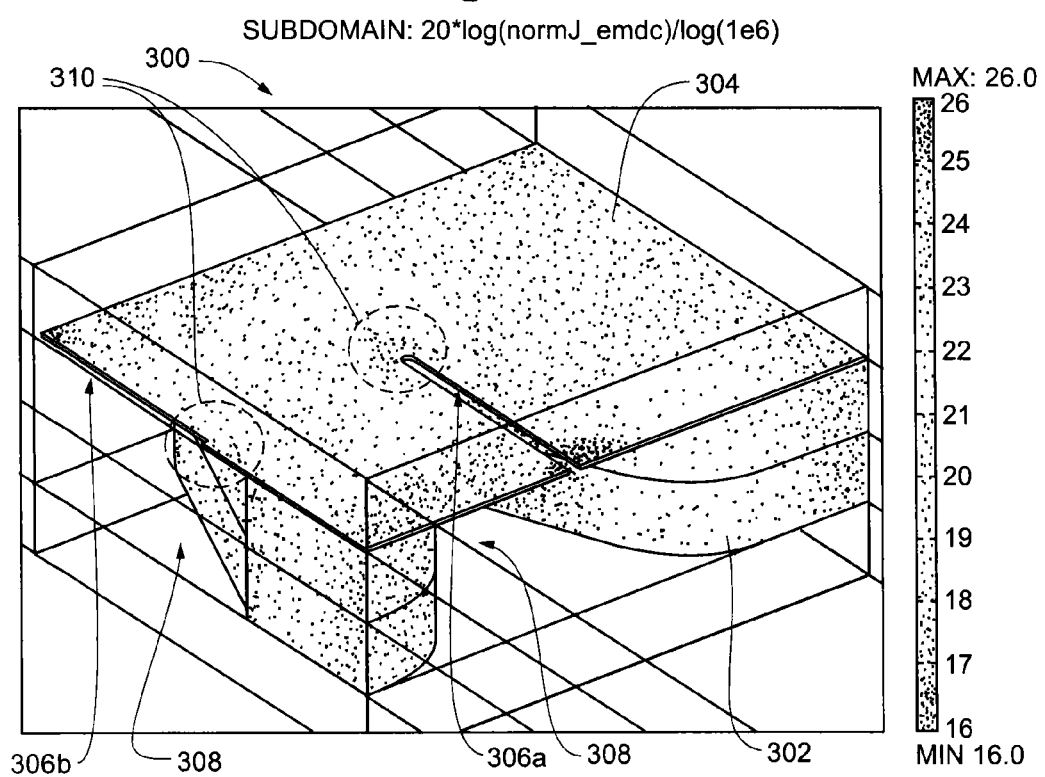

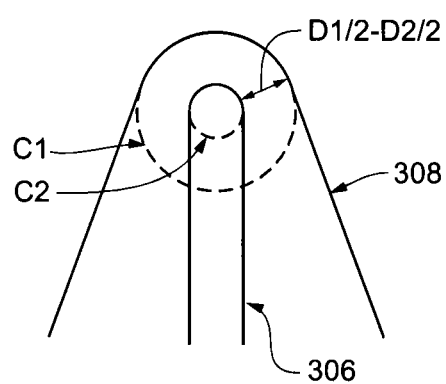

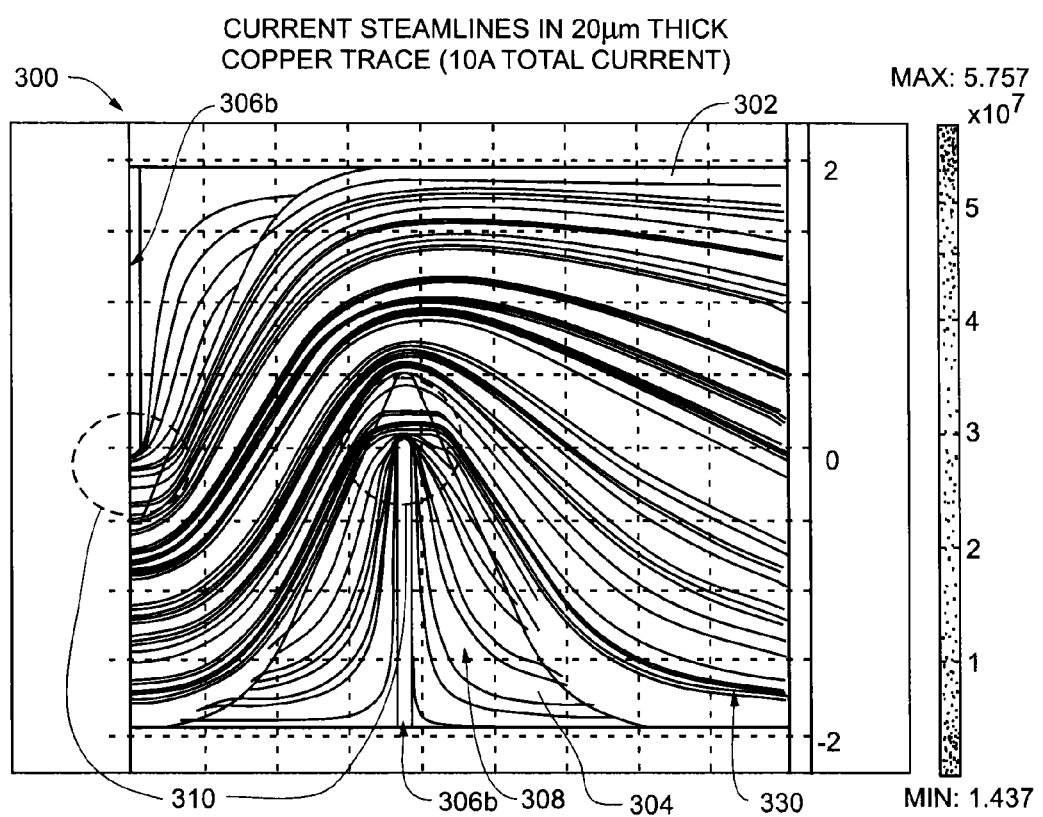

MAGNETIC FIELD CURRENT SENSORS

RELATED APPLICATIONS

This application is related to U.S. patent application Ser. No. 12/630,596, filed Dec. 3, 2009, and entitled "MAGNETIC FIELD CURRENT SENSORS," which claims priority to U.S. Provisional Patent Application Ser. No. 61/138,557, filed Dec. 18, 2008, both of which are hereby incorporated by reference in their entireties.

FIELD OF THE INVENTION

The invention relates generally to current sensors and more particularly to relatively low-cost integrated current sensors which sense current via an associated magnetic field.

BACKGROUND

Sensor modules with large magnetic cores typically are costly and bulky. An example of such a system 100 is shown in FIG. 1. In FIG. 1, a primary conductor 102 is put through a slit magnetic core 104 which collects all flux around conductor 102 and directs it onto a Hall sensor 106 placed in the air gap 108 of core 104. System 100 and others similar are not differential, which means such systems generally measure the magnetic field only at one location. If a background field is present, it can lead to errors in sensor output; although a significant part of the background field is shielded by the magnetic core, the suppression of background fields is usually not better than a factor of 100. On the other hand, these systems suffer from errors due to core imperfections, such as hysteresis, saturation, shift in offset after large overcurrent events and limited bandwidth due to eddy currents in the core or in the leadframe of the sensor.

Another sensor system 200 is shown in FIG. 2 and includes a sensor integrated circuit (IC) 202 with small magnetic concentrators 204 on top of the die 206. The sensor package 208 is a general purpose type, although package 208 may be modified to use a nonmagnetic copper leadframe material. Sensor IC 202 is placed above or below the primary conductor 210. System 200 is generally small and light-weight but can suffer from assembly tolerance issues because conductor 201 is not integrated into package 208. System 200 also suffers from limited bandwidth due to eddy currents in the leadframe of the standard IC package 208. Moreover, the suppression of horizontal background fields perpendicularly to the current trace is limited, although system 200 uses differential measurement principles (i.e., system 200 measures the magnetic field at two different places and subtracts one from the other). System 200 also needs a particular technology process to manufacture concentrators 204, which can themselves create additional errors, such as hysteresis and limited overload capability.

SUMMARY

In an embodiment, a magnetic current sensor comprises a conductor comprising a first sheet metal layer having a first thickness and comprising at least one notch extending inwardly from a first edge of the first sheet metal layer, and a second sheet metal layer having a second thickness less than the first thickness and comprising at least one notch, the second sheet metal layer being coupled to the first sheet metal layer such that the at least one notch of the first sheet metal layer is generally aligned with the at least one notch of the second sheet metal layer; and an integrated circuit (IC) die comprising at least one magnetic sensor element and being coupled to the conductor such that the at least one magnetic sensor element is generally aligned with a tip of the at least one notch of the second sheet metal layer.

In an embodiment, a magnetic current sensor comprises a conductor comprising a first sheet metal layer having a first thickness and comprising at least one hole, and a second sheet metal layer having a second thickness less than the first thickness and comprising at least one notch, the second sheet metal layer being coupled to the first sheet metal layer such that the at least one hole of the first sheet metal layer at least partially overlaps with the at least one notch of the second sheet metal layer; and an integrated circuit (IC) die comprising at least one magnetic sensor element and being coupled to the conductor such that the at least one magnetic sensor element is generally aligned with a tip of the at least one notch of the second sheet metal layer.

In an embodiment, a conductor of a magnetic current sensor integrated in an integrated circuit (IC) comprises a first metal layer having a first thickness and comprising at least one void; and a second metal layer having a second thickness less than the first thickness and comprising at least one void, the second metal layer being coupled to the first metal layer such that the at least one void of the first metal layer at least partially overlaps the at least one void of the second metal layer.

In an embodiment, a method comprises providing a magnetic current sensor having at least one sensing element positioned relative to a current-concentrating element of a conductor of the sensor, the conductor comprising a first metal layer and a second metal layer, the first metal layer having a first thickness greater than a second thickness of the second metal layer and comprising notch having a tip with a radius, the second metal layer being coupled to a die and comprising a notch having a generally pointed tip; and sensing a current proximate the current-concentrating element by the at least one sensing element.

In an embodiment, a magnetic current sensor conductor comprises two electrically coupled layers, each layer comprising at least one notch, the at least one notch of the first layer and the at least one notch of the second layer arranged to define a minimum current path length in the conductor that is shorter than a current path length in a thicker one of the two electrically coupled layers; a current input contact; and a current output contact.

BRIEF DESCRIPTION OF THE DRAWINGS

The invention may be more completely understood in consideration of the following detailed description of various embodiments of the invention in connection with the accompanying drawings, in which:

FIG. 3C is another depiction of the conductor of FIGS. 3A and 3B according to an embodiment.
FIG. 3E is a diagram of dimensions depicted in FIG. 3D according to an embodiment.
FIG. 5 depicts current streamlines in a conductor according to an embodiment.

Figure 1:
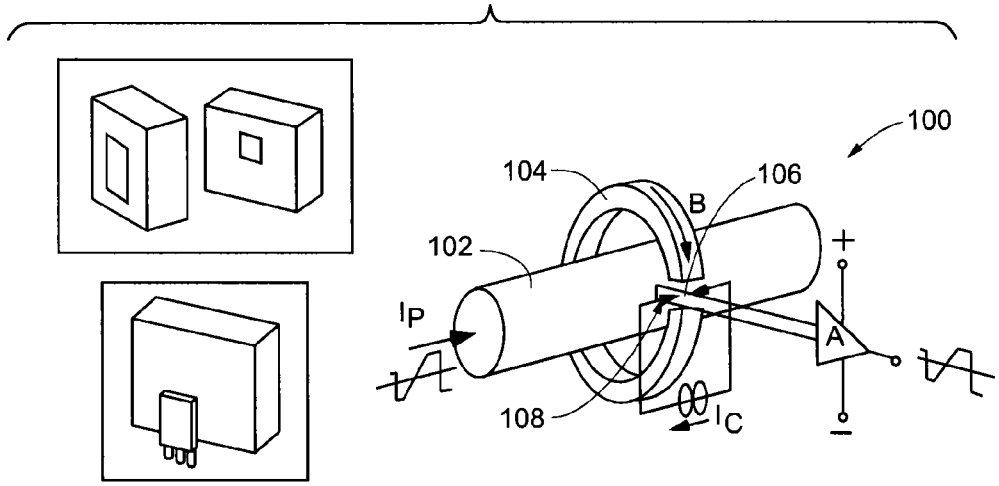
FIG. 1 depicts a conventional sensor system.
Figure 2:
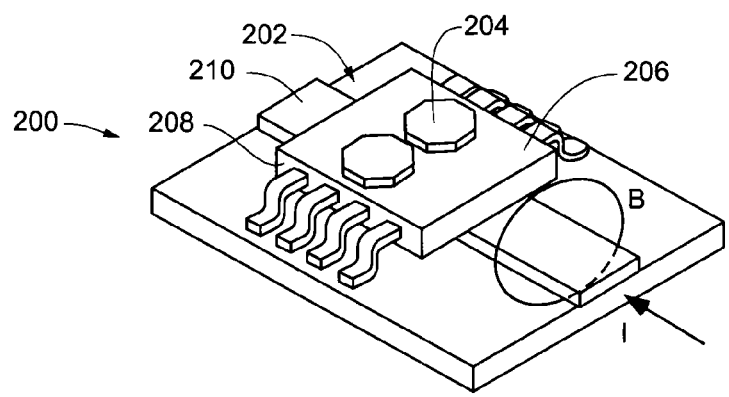
FIG. 2 depicts a conventional sensor system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention relates to a low-cost integrated current sensor. In embodiments, stacked layers of sheet metals form a current sensor conductor. In one embodiment, a first sheet metal layer is relatively thick compared to a second sheet metal layer stacked therewith.

In one embodiment, a sheet metal element is coupled to at least a portion of a top surface of a sensor die. The sheet metal element forms a conductor for current to be measured by magnetic field sensors, such as Hall elements, on the sensor die via an associated magnetic field, and in one embodiment there is no electrically conductive connection between the sensor die and the conductor. It is advantageous in various embodiments to also use the sheet metal as a leadframe portion for the pins of the sensor die. Electric contact can be established between the sensor die and the pins via through-wafer contacts, ordinary bond loops or flip-chip assembly of the die in various embodiments. Electric isolation can be accomplished by use of an isolating film, such as a dielectric in one embodiment, on the wafer top or bottom side, an isolating die-attach tape or an isolating die-attach adhesive in various embodiments. Structural integrity between the conductor and the die may also be maintained by a floating metal portion on top of the isolating film and soldering, such as diffusion soldering, of the conductor to the metal.

For example, one embodiment comprises a package and an integrated circuit, and at least a portion of the semiconductor die is covered by an electrically isolating film, on top of which a leadframe is attached. The leadframe can have a sheet metal configuration, meaning that the lateral dimensions are more than about five times larger than the thickness in one embodiment, and the leadframe is not electrically coupled to the bulk of the semiconductor die, providing several kilovolts of isolation voltage. The leadframe can also comprise a contact in order to through-pass a current. Thus, the current can flow in close proximity above the surface plane of the die, such as about 20 micrometers in one embodiment.

In one embodiment, the current sensor comprises at least one magnetic sensing element. In other embodiments, the sensor comprises a plurality of magnetic sensing elements, such as at least three magnetic sensing elements. The magnetic sensing elements can comprise planar Hall plates, and the Hall plates can be aligned and in one embodiment are aligned parallel to a general global direction of the line of Hall probes in close proximity to a current sensor that processes the signals of the magnetic sensing elements according to the relationship:

$$S_{total} = S_{left} + S_{right} - 2 * S_{center}$$

in order to suppress not only homogeneous background fields but also fields with linear gradients.

The conductor can be shaped such that, moving along the strongest current line, Hall probes are alternately arranged on the left and right sides. In one embodiment, a generally flat conductor is used, with current flowing in a longitudinal direction relative to the configuration of the conductor, and the conductor can comprise one or more slots formed perpendicular or parallel to the global current direction. In one embodiment, the slots extend approximately from the edge of the conductor to the center line. In other embodiments, one or more slots can extend past the center line or less than to the center line. Other geometric features of the slots can also vary according to embodiments. For example, the slots can be generally longitudinal, have an approximate V-shaped profile, and/or have square or rounded end geometries, among others. Planar Hall probes can be arranged above or below an end of each slot in one embodiment. The conductor may also be extended such that it comprises several layers isolated from each other and connected in series or parallel.

The magnetic sensitivity of the Hall plates of the sensor system can be adjusted to match at least to about one part in 100 in an embodiment, or one part in 10,000 in another embodiment. Embodiments of the sensor system can maintain this matching in spite of temperature and mechanical stress drift throughout the lifetime of the sensor. The sensor system can also use a spinning current technique to reduce the offset down to at least about 100 microteslas (μT) throughout the working temperature range in an embodiment.

Embodiments relate to shapes and configurations of the magnetic field sensors and a primary conductor of a current sensor system, such that the sensor system has one or more advantageous characteristics. In one embodiment, the magnetic field sensors and/or primary conductor can be designed such that a large magnetic field gradient, linear or having a higher spatial derivative, can be generated on the surface of a semiconductor die coupled to the conductor. In an embodiment, the magnetic field can have a major portion perpendicular to the die surface such that a planar Hall sensor element can detect the field and the internal resistance of the conductor is as low as possible. Further, the magnetic field sensors and/or the primary conductor can be designed such that the thermal resistance between points of maximum current density and ambient is as low as possible, and that the mechanical stiffness of conductor and die are maximized. It is also desired that the sensed current not be influenced by nearby currents, or crosstalk and that the conductor not generate a notable field on other components, such as other current sensors nearby. Additionally, the shape of the conductor can be relatively simple and capable of being assembled with packaging, assembling and other procedures commonly used in the semiconductor industry.

The system can comprise a sensor integrated circuit (IC) configured to provide an output signal that includes information about a current flowing through a primary conductor. In one embodiment, there is no galvanic connection between the primary conductor and the sensor IC. To this end, the sensor IC comprises at least one magnetic field sensor configured to respond to the magnetic field originating from the current through the primary conductor. The sensor IC is held in a well-defined position with respect to the magnetic field of the conductor. In one embodiment, the magnetic field of the conductor is not further amplified or collected by a magnetic fluxguide circuit, such as a soft magnetic material, because this could increase cost and weight and reduce accuracy. In other embodiments, however, it may be advantageous to integrate one or more small magnetic flux guides into the sensor package, such as sputtered on top of the die.

In various embodiments, the sensor signal advantageously has only a small additive error, or offset. In one embodiment, the sensor signal is zero at zero amps, with as small an error as possible. The sensor signal advantageously also has only a small gain error. For example, at full scale current the output should stay constant versus temperature and lifetime. The sensor signal also have a bandwidth that ranges from DC to about 100 kilohertz (kHz) or higher, as well as a small reaction time, such as about one microsecond ($\mu$s) in one embodiment.

In embodiments, the nominal current range is about one amp (A) to about one kiloamp (kA), such as about one kA in one embodiment. The current sensor has a small size with respect to volume and footprint in various embodiments and is also light-weight, but remains robust against external magnetic fields, temperature, moisture, overload current through the primary conductor, and voltage swing between the primary conductor and the ground of the sensor IC. In one embodiment, the current sensor can withstand a current that is about ten times or more of the nominal current. The voltage isolation between the primary conductor and the sensor IC is on the order of kilovolts in various embodiments. The current sensor also has low power consumption, such as less than about 50 milliwatts (mW) in one embodiment, and low power dissipation in the primary conductor. Over-temperature due to self-heating of the sensor is also low in embodiments.

The output signal of the sensor IC can comprise an analog voltage or current, a frequency, a pulse-codemodulated or pulse-width-modulated wave, a digital code or some other signal form. As mentioned above, the sensor output signal can convey information about the current, such as magnitude of the current, flow direction, phase, frequency, harmonic content and frequency spectrum, time integrals or time derivatives thereof, and other information.

The sensor system can be fabricated according to a standard CMOS process combined with advanced packaging technology in one embodiment. This combination enables use of a single type of silicon die, and therefore a single layout, for a wide range of current sensors.

In one embodiment, the leadframe can be omitted, which avoids induced eddy currents and bandwidth limitations. Because the current to be measured needs a primary conductor, the primary conductor can be used in one embodiment as a die paddle or mounting plate to which the die is attached. Note that eddy currents induced in the primary conductor do not disturb the magnetic field sensor but do increase the impedance of the primary conductor, which is driven by a strong generator. By way of finite-element simulations, it can be demonstrated that a sensor die attached to an ordinary copper leadframe having a thickness of about 0.2 millimeters (mm) and placed near a conductor has a −3 dB bandwidth of 15 kHz due to eddy currents induced by the field of the conductor in the leadframe. If the current passes through the leadframe itself and there is no other good conductor close to the magnetic field elements, the bandwidth increases far above 100 kHz.

In conventional leadframes, the die paddle and the ground pin are one single part stamped out of a sheet metal. This provides good structural stability and is easily manufacturable. It also ties the die to ground potential via low impedance. In one embodiment of the current sensor, the primary conductor serves as a die paddle, yet it is galvanically isolated from the die. Therefore, ground potential is connected to the die like all other pins, such as via thin bond wires. This provides an additional advantages in that all pins of the sensor circuit are connected via thin bond wires. Therefore, if a short accidentally occurs between the primary conductor and any of the pins of the sensor circuit, this short cannot transfer a large amount of power because the thin bond wire acts as a fuse, which is quickly blown.

Figure 3A:
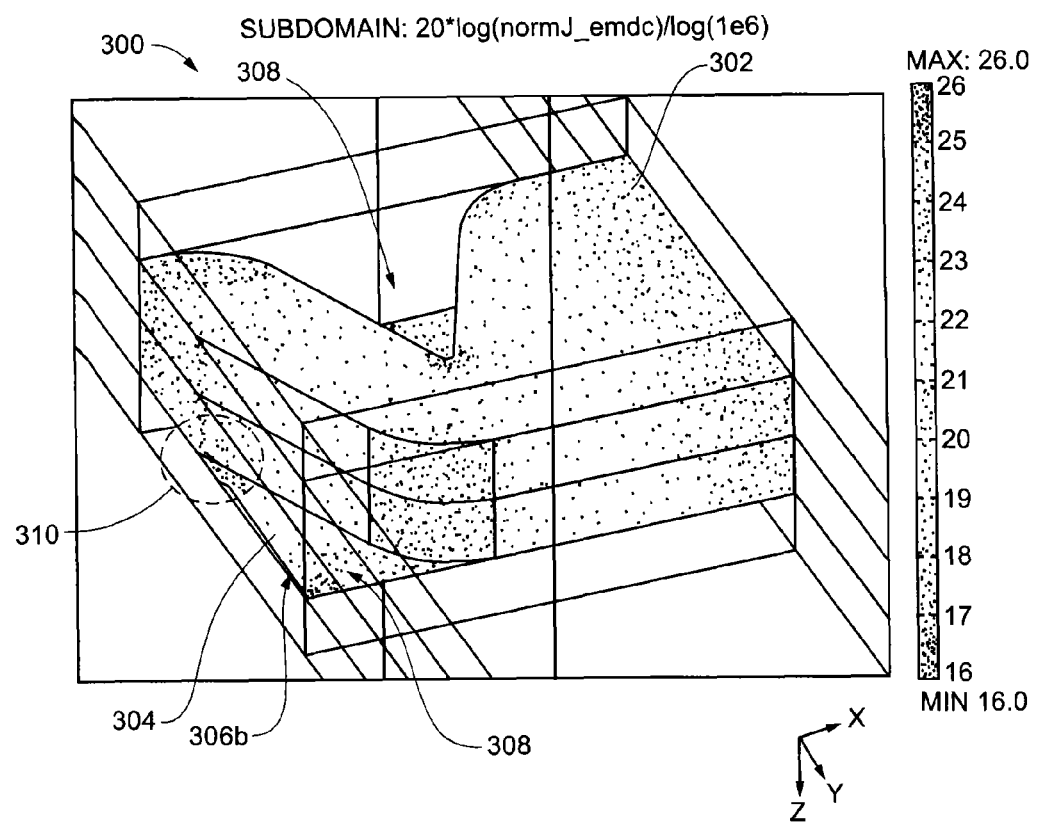
FIG. 3A depicts a conductor according to an embodiment.
Figure 3B:
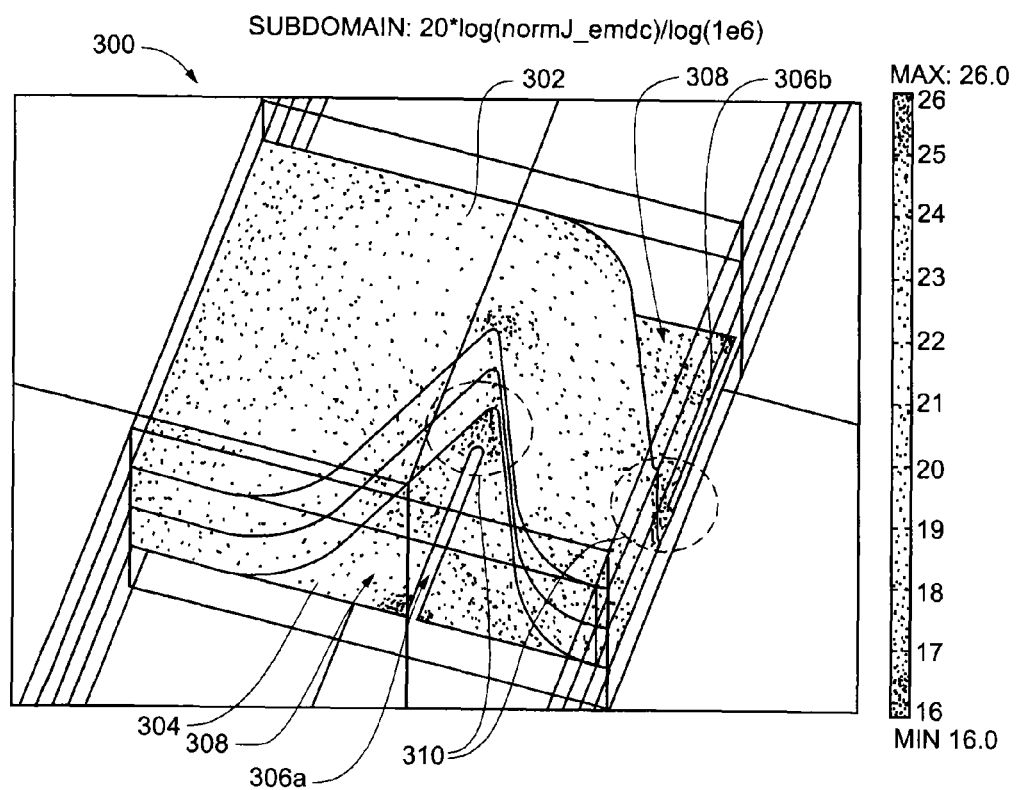
FIG. 3B is another depiction of the conductor of FIG. 3A according to an embodiment.

Referring to the views of FIG. 3, in particular FIG. 3A, a conductor 300 of a current sensor is depicted. Conductor 300 comprises stacked sheet metal layers in an embodiment, such as a leadframe 302 and a power metal portion 304. Only the right half of conductor 300 is shown, with the yz-plane of conductor 300 being a symmetry plane. The entire conductor 300 can be obtained by extending the mirror image of conductor 300 in FIG. 3B generally to the right, such that conductor 300 would then comprise three slots 306: the first 306a as depicted in FIG. 3, a second 306b for which half is shown in FIG. 3B, and a third being the mirror image of slot 306a on the right side of conductor 300. Slots 306 are generally aligned with notches 308 formed in leadframe 302.

In an embodiment, leadframe 302 and power metal portion 304 comprise copper. Leadframe 302 is relatively thicker than power metal portion 304. For example, leadframe 302 is about 1.2 mm thick and power metal portion 304, about 20 $\mu$m in one embodiment. Because power metal portion 304 can be manufactured in the semiconductor fab, portion 304 can be precisely patterned, such as within about 0.5 $\mu$m accuracy in an embodiment. Leadframe 302 can then be soldered onto power metal portion 304 in an embodiment during a packaging process. This means that leadframe 302 will be generally less well-aligned with sensor elements, such as Hall probes, of the sensor, such as within about 50 $\mu$m accuracy. This is not significantly disadvantageous, however, because the highest current densities are found in power metal portion 304, particularly in the regions 310 of the ends of slots 306 because the current tries to find the shortest path through conductor 300. The geometry of power metal portion 304, with slots 306, concentrates the current in regions 310 as the current seeks this shortest path.

Power metal portion 304 may be more precisely aligned with respect to the die, while it may also be manufactured more accurately than leadframe 302 because it is generally easier to manufacture slots and holes in a thin metal than a thick metal. It is generally not possible to manufacture slots with a punching process if a width of the slots is less than the sheet metal thickness. If slots and holes are formed by etching, their side walls may not be straight, instead conical in that they may be narrower at the surface where etching began. Therefore, if a total conductor thickness of, for example, 1 mm, in order to have sufficiently small internal resistance for a 200 A current, a slot would be about 1 mm wide. For about 0.3 mm wide, one could stack a 0.3 mm thick sheet metal with a 0.7 mm thick one and make a 0.3 mm wide slot in the thin sheet and a 0.7 mm wide slot in the thick sheet. If an alignment tolerance of thick and thin sheets is better than about (0.7−0.3)/2=+/−0.2 mm, the current path around the fine slot will not be shorted by the thick sheet.

A majority of current flow in conductor 300 flows through leadframe 302. However, due to the dissimilar shape and arrangement of notches 308 with respect to slots 306, current flowing through power metal portion 304 takes a sharper angular deviation, or bend, around each slot 306 compared to current flowing around notches 308 of leadframe 302. This arrangement results in a higher level of current density in regions 310 compared to a current density of other regions of leadframe 302 and power metal portion 304. Thus, while a majority of current flows through leadframe 302 with a lesser internal resistance compared to if leadframe 302 itself had slots similar to slots 306 resulting in less internal resistance, a small portion of the current flows in a more angular path around slots 306 through power metal portion 304. As such, a sensor element disposed proximate power metal portion 304, and more particularly slots 306, can more accurately sense current because of the increased current density in regions 310.

Various configurations of slots 306 and notches 308 are possible in embodiments. Some features and dimensions may be selected based on ease of manufacturing. For example, manufacturing tolerances can dictate that notches 308 in leadframe 302 are generally longer and wider. Additionally, notches 308 which are longer than half the width of leadframe 302, where the width is generally measured perpendicularly to the current flow in conductor 300, can increase the internal resistance unnecessarily.

Figure 3D:
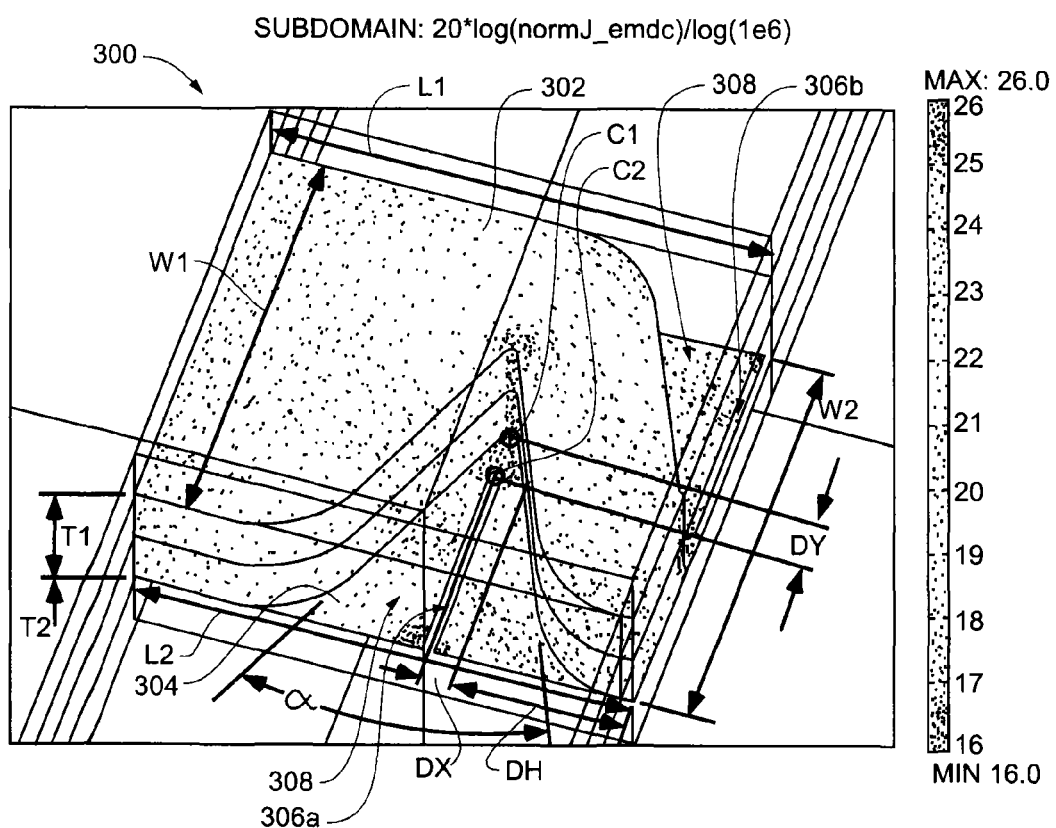
FIG. 3D is another depiction of the conductor of FIGS. 3A-C according to an embodiment.

FIG. 3D depicts various dimensions of conductor 300, with the dimensions given herein exemplary of but one embodiment. Various other dimensions, configurations and combinations thereof can be used in other embodiments, as appreciated by those skilled in the art.

T1 represents a thickness of leadframe 302. In embodiments, such as those in which the current ranges from about 20 A to about 200 A, T1 can range from about 0.2 mm to about 2.0 mm. In one embodiment, such as for about 75 A of current, T1 is about 0.5 mm.

T2 represents a thickness of power metal portion 304. In embodiments, T2 can range from about 5 µm to about 100 µm, such as about 20 µm.

C1 represents an osculating circle in a tip of notch 308 in leadframe 302. In embodiments, C1 has a diameter D1, which is described in more detail below.

C2 represents an osculating circle in a tip of slot 306 in power metal portion 304. In embodiments, C2 has a diameter D2. While a width of slot 306 is depicted in FIG. 3D as being the same as D2, the width may approach a in embodiments in order to give way to bond pads arranged underneath.

DX represents a distance between a center of C2 from an edge of leadframe 302 in the x-direction. As FIG. 3D is depicted, the x-direction runs generally left-right, while the y-direction runs generally up-down with respect to the orientation on the page.

DY represents a distance between centers of C1 and C2. DY is discussed in more detail below.

W1 represents a width of leadframe 302. In embodiments, W1 can range from about 2 mm to about 20 mm, such as about 4 mm in an embodiment.

W2 represents a width of power metal portion 304. In embodiments, W2 can be less than W1 but greater than 2*DY.

L1 represents half the length of conductor 300. As mentioned above with respect to a similar view, only half of conductor 300 is depicted in FIG. 3D. In embodiments, L1 is greater than DH (discussed below).

L2 represents half the length of power metal portion 304. In embodiments, L2 is greater than 2*DX and less than L1.

DH+DX represents a distance between a centerline of leadframe 302 and a centerline of notch 308, or the distance between two adjacent magnetic field sensor elements. DH is discussed in more detail below.

Angle α represents an aperture angle of notch 308. In an embodiment, α is about 60 degrees.

In an embodiment, an electrical isolation layer is formed between the thin conductor layer and the die. The isolation layer can comprise several layers, e.g. a stack, of isolator-conductor-isolator, where the inner conductor may be used as an electrostatic shield. To this end at least one contact is provided, which can be tied to a stable potential, such as ground.

In an embodiment, C2 covers at least 25% of an active area of a magnetic field sensor element arranged proximate. For example, a silicon Hall plate is about 50 µm by about 50 µm in an embodiment, and for offset compensation two (as a duplet) or four (as a quadruple) such plates are typically packaged together. Thus, an active area of the Hall plates is about 100 µm by about 100 µm in an embodiment. Smaller Hall plates, such as those that are about 20 µm by about 20 µm, can also be used. In embodiments, D2 is greater than about 10 µm for currents greater than about 50 A and T2 less than about 100 µm if power metal is used, because smaller diameters of D2 could increase the current density beyond the electromigration limit. Therefore, D2 is in the range of about 10 µm to about 100 µm in embodiments. Note that if nano-pastes are used instead of power metal, current density can be further reduced by a factor of about 2 to about 10.

DX, DY and D1 depend on various tolerances in embodiments, including an accuracy of the contour of notch 308 in leadframe 302 and a die-attach tolerance. In an embodiment, the die is mounted on leadframe 302 with a tolerance of about +/−100 µm. While more accurate die-attach is possible up to a few micrometers, this reduces throughput and requires non-standard assembly lines. The accuracy of notch 308 in leadframe 302 can also depend on the thickness, T1, of leadframe 302 and the tool life of the stamps forming the notches. If other techniques are used to manufacture leadframe 302, such as etching, spark eroding or others, these techniques may be more accurate but likely also more expensive. Managing costs, a typical overall accuracy of the placement of the edge of leadframe 302 with respect to the die may be +/−about 200 µm. It follows that DY should be greater than about 200 µm−(D1−D2)/2 in order to guarantee that leadframe 302 does not overlap the tip of slot 306 in power metal portion 304 even if misplacement in the y-direction is at its maximum.

Analogously, in the x-direction DX should be greater than about 200 µm−D2/2 for smaller D1s. If D1 is larger, then C2 is approximately in the center of C1, and DX loses its meaning. Referring to FIG. 3E, in embodiments the diameter of C1 will be larger than about 400 µm such that the distance between the edge of leadframe 302 and the edge of power metal portion 304 is (D1−D2)/2, which should be greater than about 200 μm in order to avoid overlay of leadframe 302 with respect to slot 306.

Figure 4:
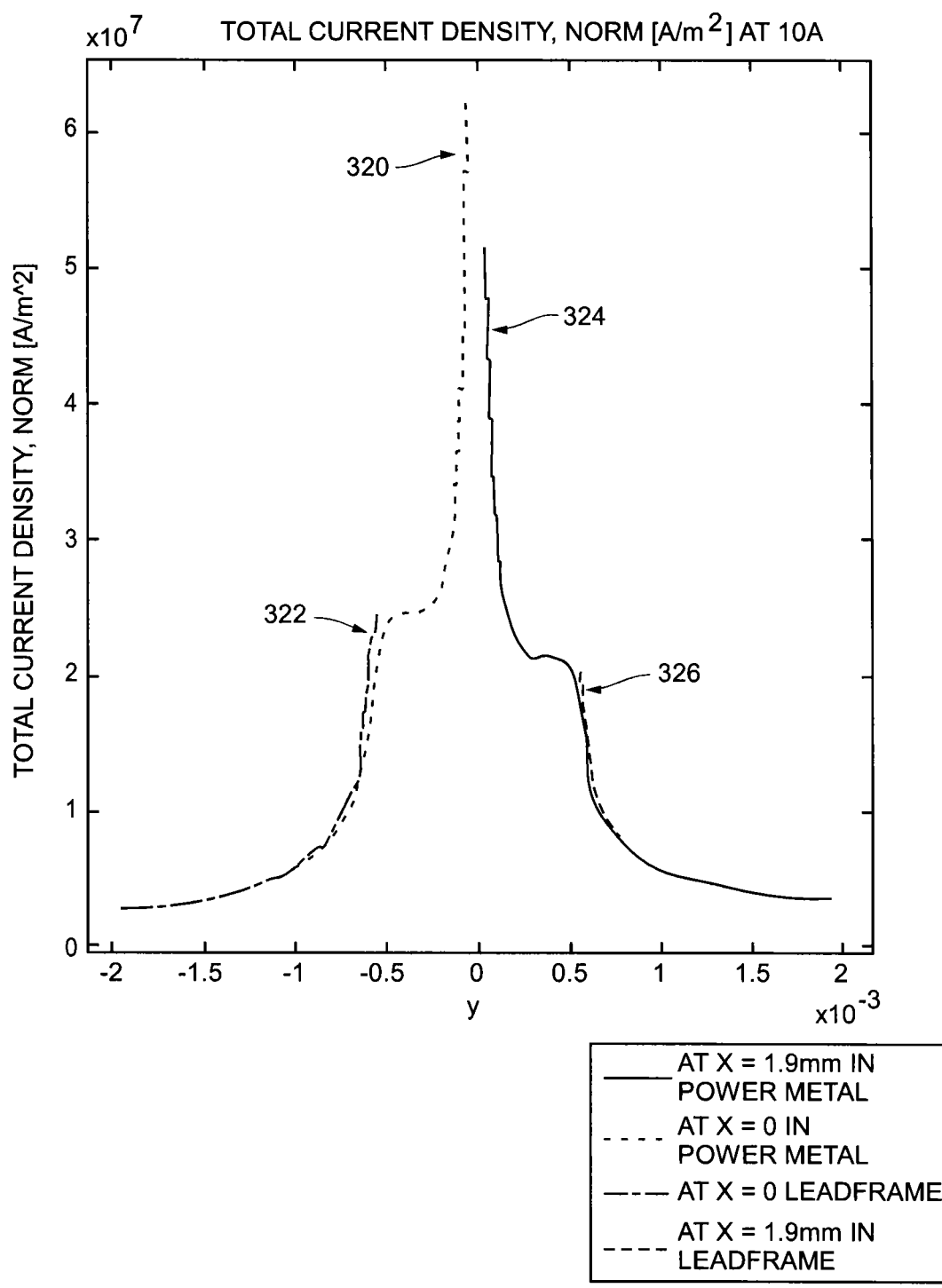
FIG. 4 depicts current densities in a conductor according to an embodiment.

FIG. 4 is a graph depicting current densities at different regions of conductor 300. Plot 320 shows current density at x=0 in power metal portion 304, plot 322 at x=0 in leadframe 302, plot 324 at x=1.9 mm in power metal portion 304, and plot 326 at x=1.9 mm in leadframe 302. In general, it can be seen that current density in the mid-plane of leadframe 302 is much lower than in a similar area of power metal portion 304. With power metal portion 304 being arranged closer to the sensor elements than leadframe 302, the sensor elements are advantageously exposed to the highest flux density when positioned proximate the ends of slots 306, as previously mentioned. In an embodiment, a peak value of the current density in power metal portion 304 is about 65 A/mm$^2$ for a total current of about 10 A, while conductor 300 has an overall internal resistance of about 92μΩ. Thus, at about 100 A, dissipation is only about 0.92 W and the peak current density is about 650 A/mm$^2$ in an embodiment, which is low enough to avoid electromigration damage in copper.

Increased current densities in the regions of slots 306 can be seen in FIG. 5, which shows current flowlines 330 through conductor 300. Highlighted regions 310 show increased current densities in power metal portion 304 near the ends of slots 306 as the current flows near and around the ends.

Figure 6A:
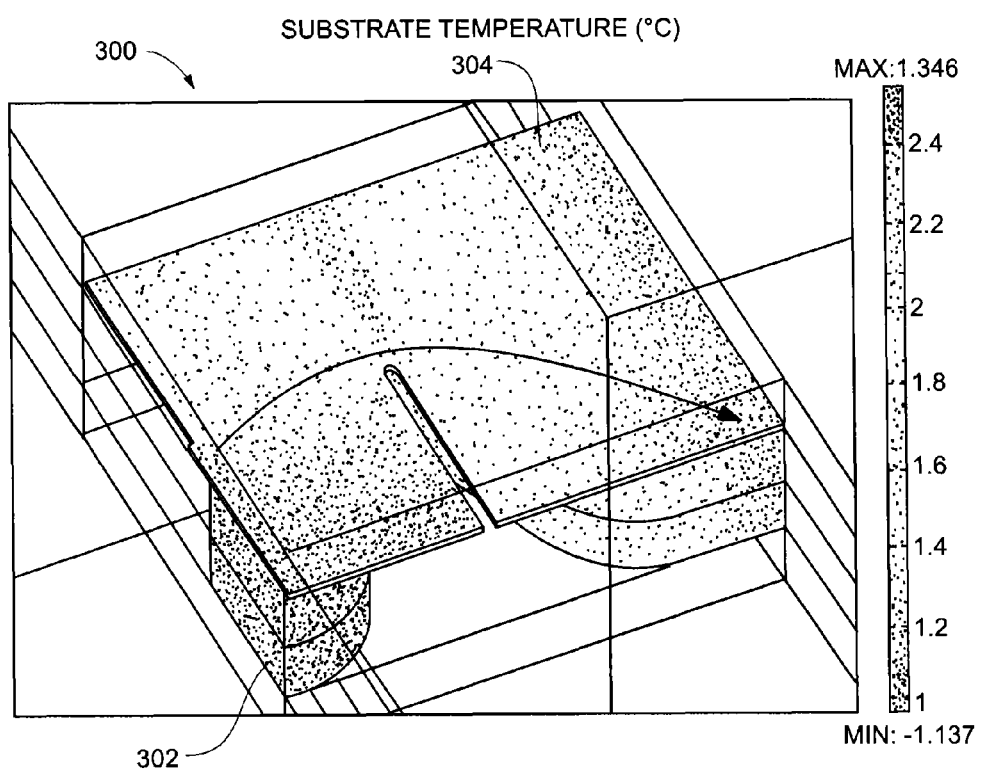
FIG. 6A depicts temperature variations in a conductor according to an embodiment.
Figure 6B:
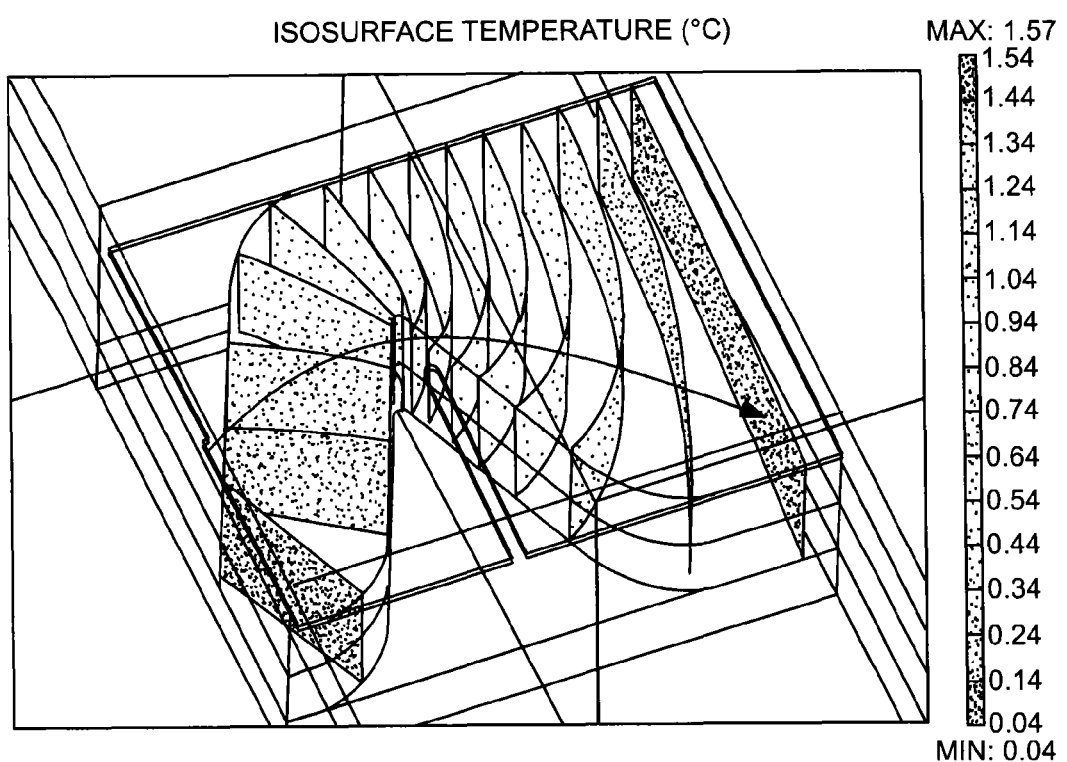
FIG. 6B depicts temperature variations in a conductor according to an embodiment.

FIGS. 6A and 6B depict thermal representations of conductor 300 according to one embodiment. The arrow superimposed on conductor 300 flows from the highest temperature region at the left edge of conductor 300 to the lowest temperature region along the right side. If the end surfaces of leadframe 302 are kept at fixed temperatures, the over-temperature along the surface of power metal portion 304 is relatively low: at a total current of about 100 A, with about 0.92 W of dissipation, and under the assumption that other surfaces are thermally insulated, the peak over-temperature is only about 1.5 degrees C. Thus, conductor 300 can withstand over-current events that dissipate considerably more energy than at full-scale current of the measurement range.

Figure 7A:
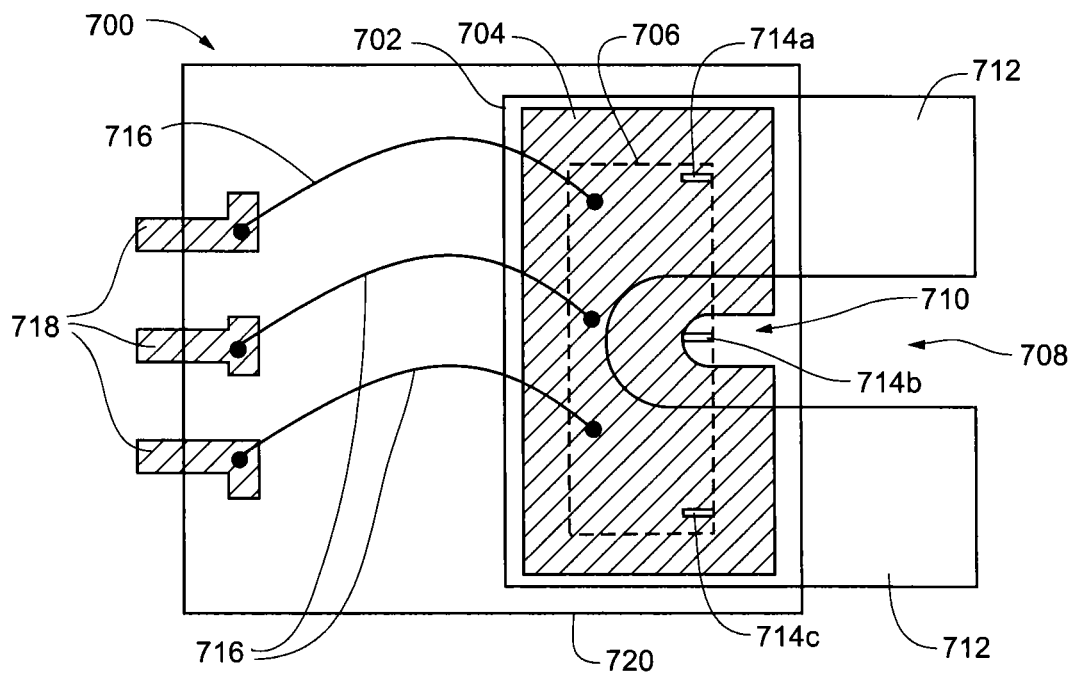
FIG. 7A depicts a top view of a current sensor according to an embodiment.
Figure 7B:
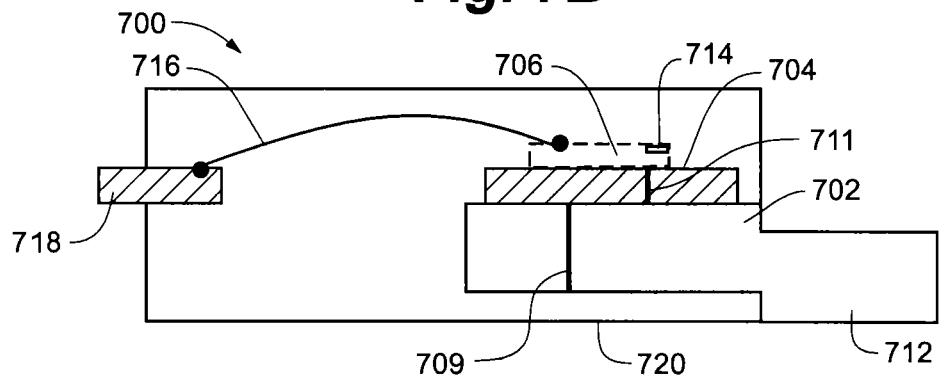
FIG. 7B depicts a cross-sectional side view of the sensor of FIG. 7A.
Figure 7C:
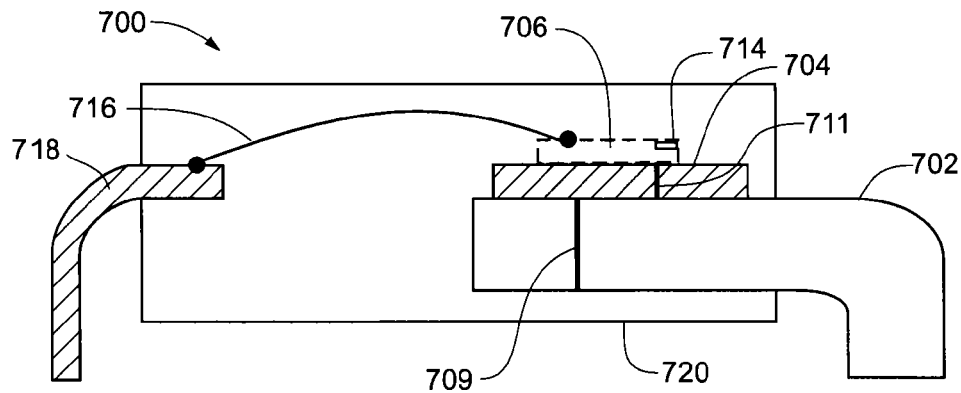
FIG. 7C depicts a cross-sectional side view of another embodiment of the sensor of FIGS. 7A and 7B.

Another embodiment is depicted in FIG. 7, with a top view shown in FIG. 7A and cross-sectional view in FIG. 7B. The embodiment of FIG. 7, as well as other embodiments, includes focuses more on accurate patterning of the conductor layer than other embodiments in which the significance of accurate alignment was emphasized. Alignment can be improved in principal by more expensive fabrication and manufacturing machines and can be accounted for during end-of-line calibration. Accurate patterning, however, is also relevant. If the conductor is, for example, about 2 mm thick for a 500 A sensor, and the slots are not narrower than about 2 mm give conventional punching techniques in which the width of the slot is generally not narrower than the thickness of the sheet metal, it can be challenging to accommodate more than one slot beneath a die, if the die is only about 3 mm by about 2 mm in size.

Therefore, in embodiments at least two layers of sheet metal are stacked to form a conductor. Such a configuration is depicted in FIG. 7, which shows a sensor element 700. Sensor element 700 includes a first sheet metal layer 702 and a second sheet metal layer 704 in a stacked configuration with a semiconductor die 706. First layer 702 comprises a void or notch 708, and second layer 704 also comprises a notch 710. First layer 702 also comprises contact portions 712 for a primary current.

Sensor elements 714a, 714c and 714c, such as planar Hall plates, are disposed about the conductor, with sensor element 714b generally arranged along a symmetry line and near an interior end 711 of notch 710, shifted with respect to an interior end 709 of notch 708. While three sensor elements 714a-c are depicted, more or fewer sensor elements can be used in other embodiments, as is generally the case herein throughout. In an embodiment, sensor element 714b is positioned about 50 μm from the interior end of notch 708. Bond wires 716 couple the conductor to low voltage pins 718 of die 706. Pins 718 can comprise a portion of the same layer as layer 704 in an embodiment and can be configured for a through-hole device, such as by a downward bending of pins 718 and/or the current rail of layer 702 as depicted in the embodiment FIG. 7C. A sensor package 720 is also depicted, which in one embodiment is a mold body.

First sheet metal layer 702 is relatively thick compared to second sheet metal layer 704. For example, first sheet metal layer 702 can be about 0.3 mm to about 3 mm thick, while second sheet metal layer 704 can be about 0.1 mm to about 0.4 mm thick, in embodiments.

Second layer 704 can be produced during a front-end semiconductor manufacturing process, though it is also possible for one or both of layers 702 and 704 to be produced by a leadframe manufacturer. Second sheet metal layer 704 may be manufactured by an etching process, whereas first layer 702 may be obtained by punching and pressing in embodiments. First sheet metal layer 702 may be not even in the shape of a sheet metal, instead comprising a massive clip in an embodiment; nevertheless, its thickness is generally less than both lateral dimensions, with lateral being parallel to the primary surface of die 706. Because second metal layer 704 is not linked to the semiconductor manufacturing process in embodiments, layer 704 can overlap the edges of die 706.

Another aspect to consider is the attachment of layers 702 and 704 of the conductor. In one embodiment, layers 702 and 704 are attached along an entire contact surface with an electrical conductor, which is also rigid enough not to change the position of layers 702 and 704 during the sensor lifetime or when the sensor is soldered or bolted to conductors. In an embodiment, attachment is by diffusion soldering. In another embodiment, attachment is by ultrasonic welding, which can be advantageous because a welded joint can be less prone to stress from electromigration and thermal cycling than a soldered joint. An optional electrical isolation layer between die 706 and the conductor can also be included though is not depicted in FIG. 7.

In general, notch 710 of layer 704 is finer, such as narrower and shallower, than notch 708 of layer 702. As depicted in FIG. 7B, layer 704 is also positioned closer to sensor elements 714 than layer 702.

Figure 8:
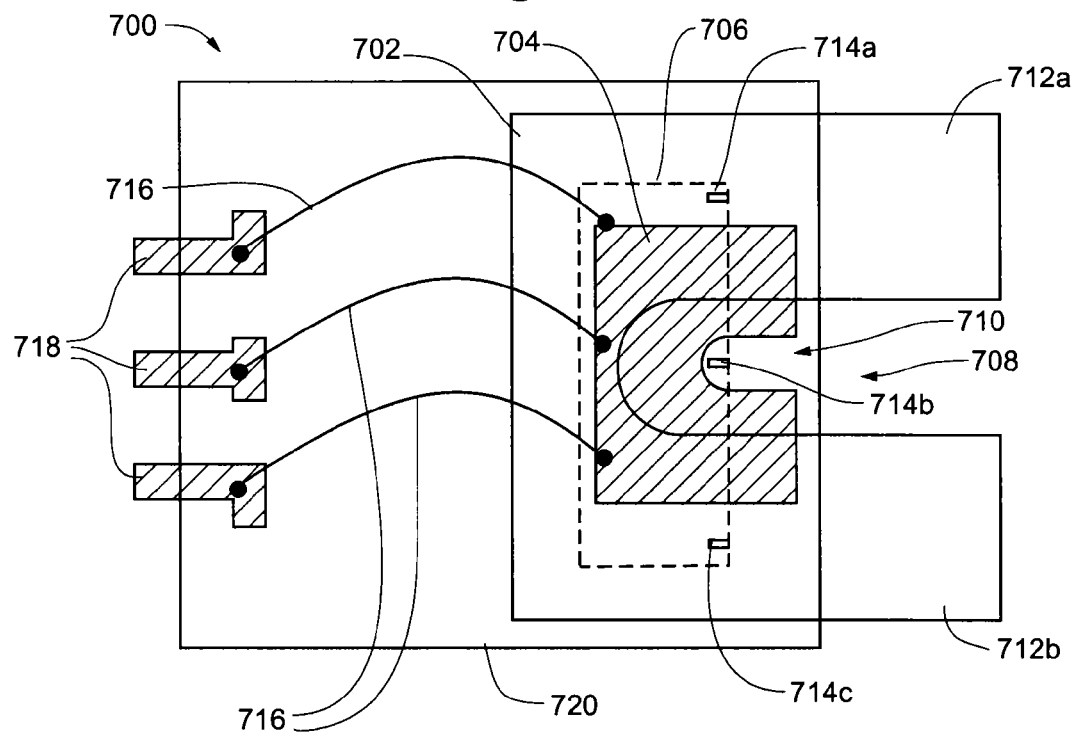
FIG. 8 depicts a top view of a current sensor according to an embodiment.
Figure 9:
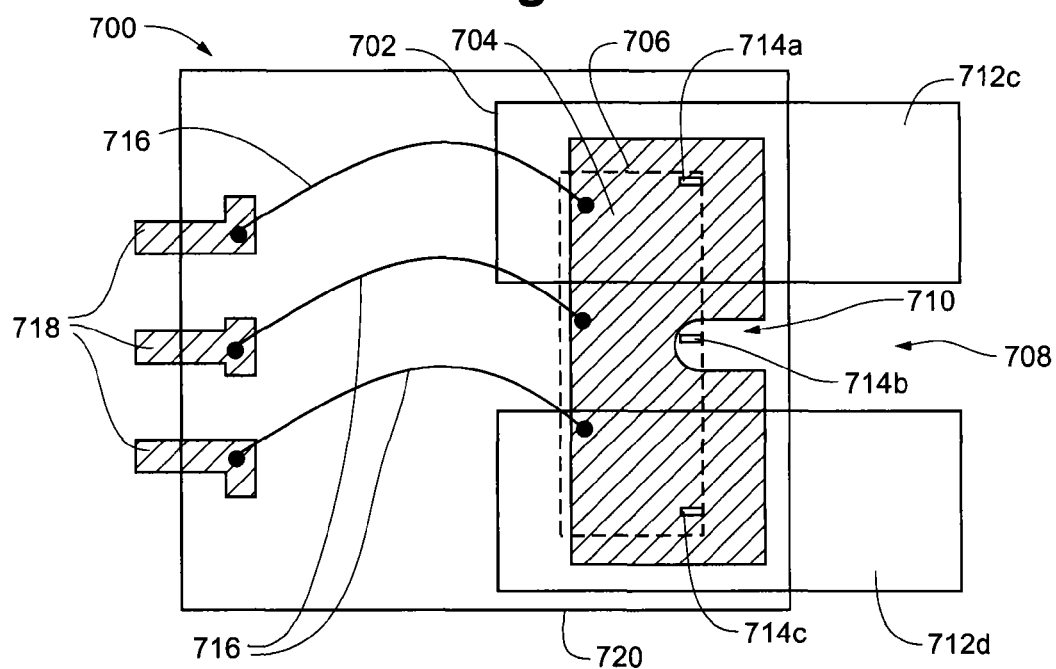
FIG. 9 depicts a top view of a current sensor according to an embodiment.

In another embodiment, and referring to FIG. 8, thin metal layer 704 may be smaller than die 706 in one or both lateral dimensions. In general, layer 704 shorts the current around the notch 708 of layer 702, providing a low ohmic path for the current on its way between 712a and 712b. Although layer 704 is thinner than layer 702, layer 704 provides a lower ohmic path if this path is shorter around notch 708. In other words, layer 704 must make up for its deficit in thickness by providing an attractive lateral shortcut. Layer 704 should also have sufficient contact area with layer 702, or the current cannot flow from layer 702 to layer 704 and back in the area of notch 708. Referring to FIG. 9, layer 702 can also comprise two portions, 712c and 712d.

Figure 10:
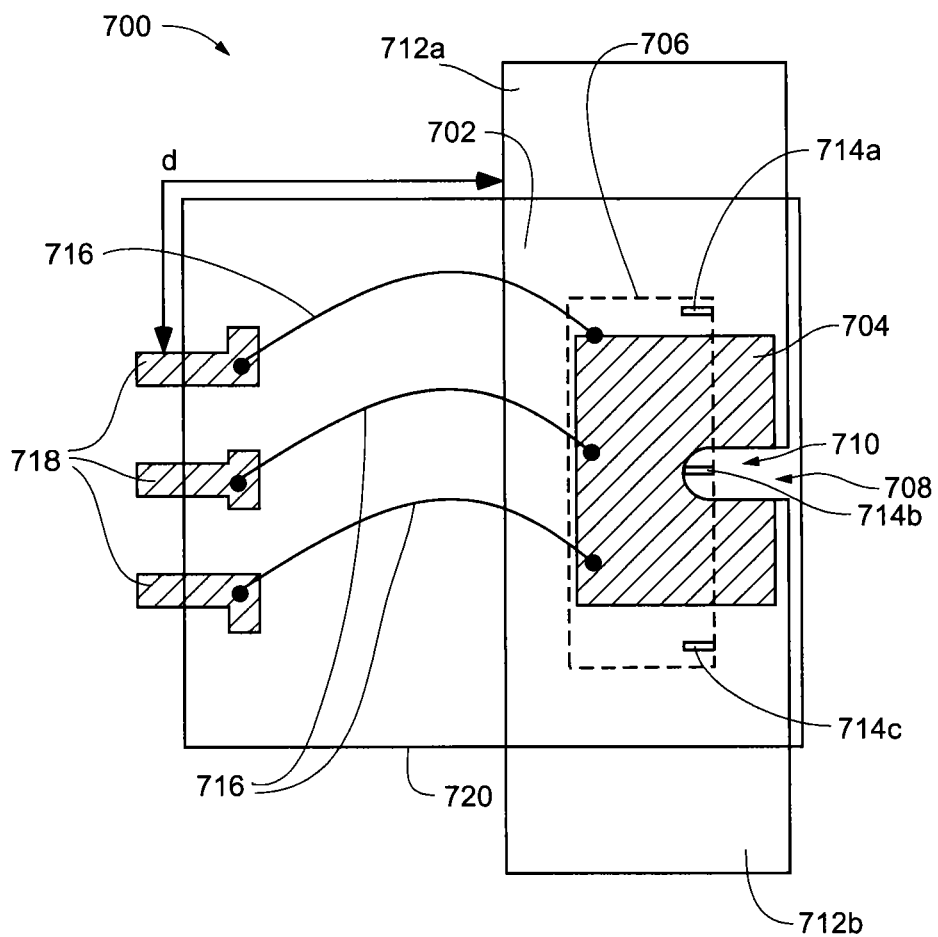
FIG. 10 depicts a top view of a current sensor according to an embodiment.

As illustrated in FIG. 10, the global current path need not be U-shaped. In an embodiment, the current path is I-shaped, which can offer lower resistance with less creepage distance between pins 718 and the current rail of layer 702, shown at d.

Figure 11:
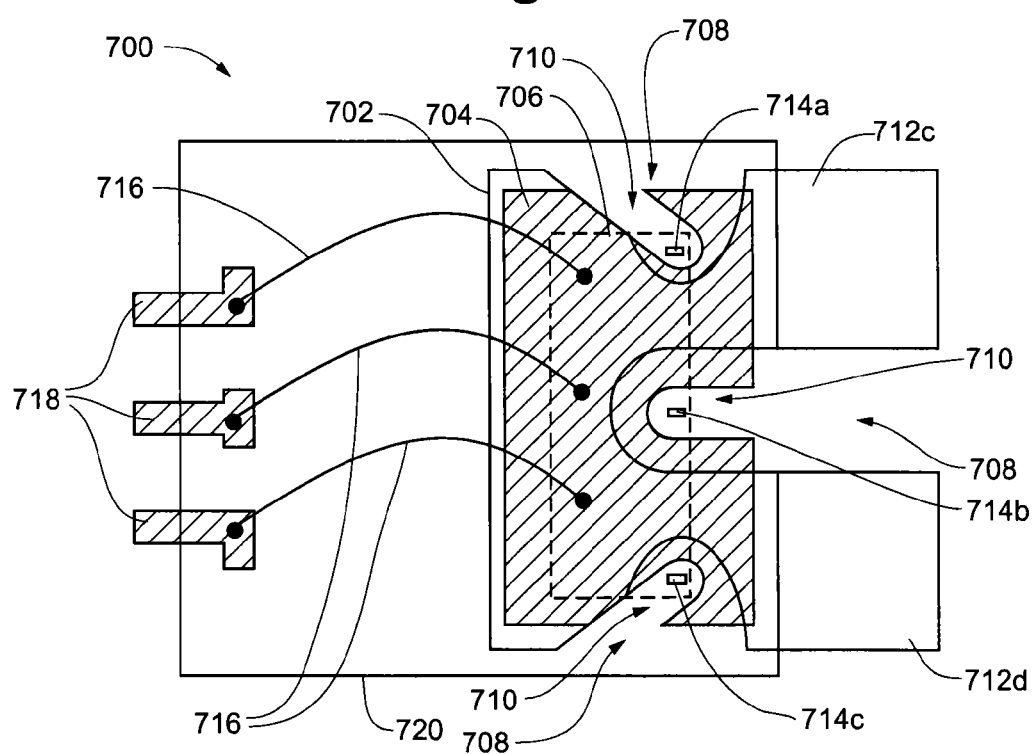
FIG. 11 depicts a top view of a current sensor according to an embodiment.
Figure 12:
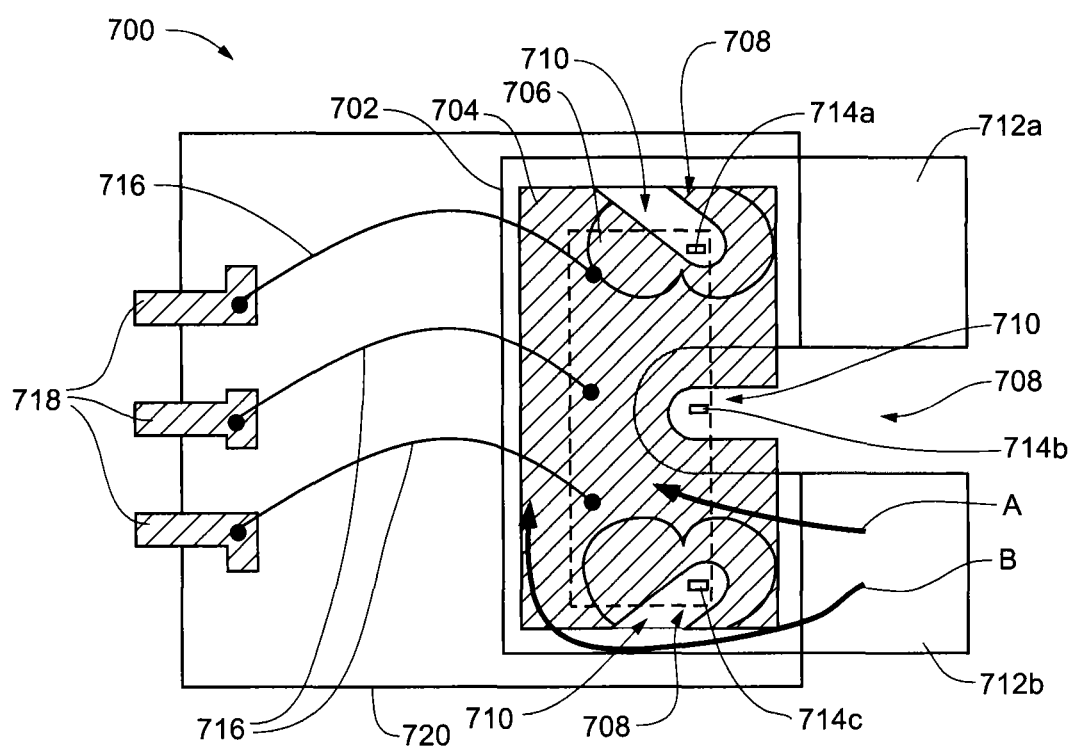
FIG. 12 depicts a top view of a current sensor according to an embodiment.

The number and configuration of notch 708 and/or notch 710 can also vary. For example, the embodiment depicted in FIG. 11 comprises three notches 708 and 710, though other embodiments include more or fewer. In FIG. 12, layer 702 includes two holes 709 in addition to notch 708 in layer 702. Such a configuration can be appropriate if the second current path B in layer 702 is reasonably long so that only a negligible part of the current flows through layer 702 as compared with the first current path A). An advantage of such a configuration is an increased stiffness of layer 702. From a fabrication perspective, holes 709 may be stamped or drilled.

Figure 13A:
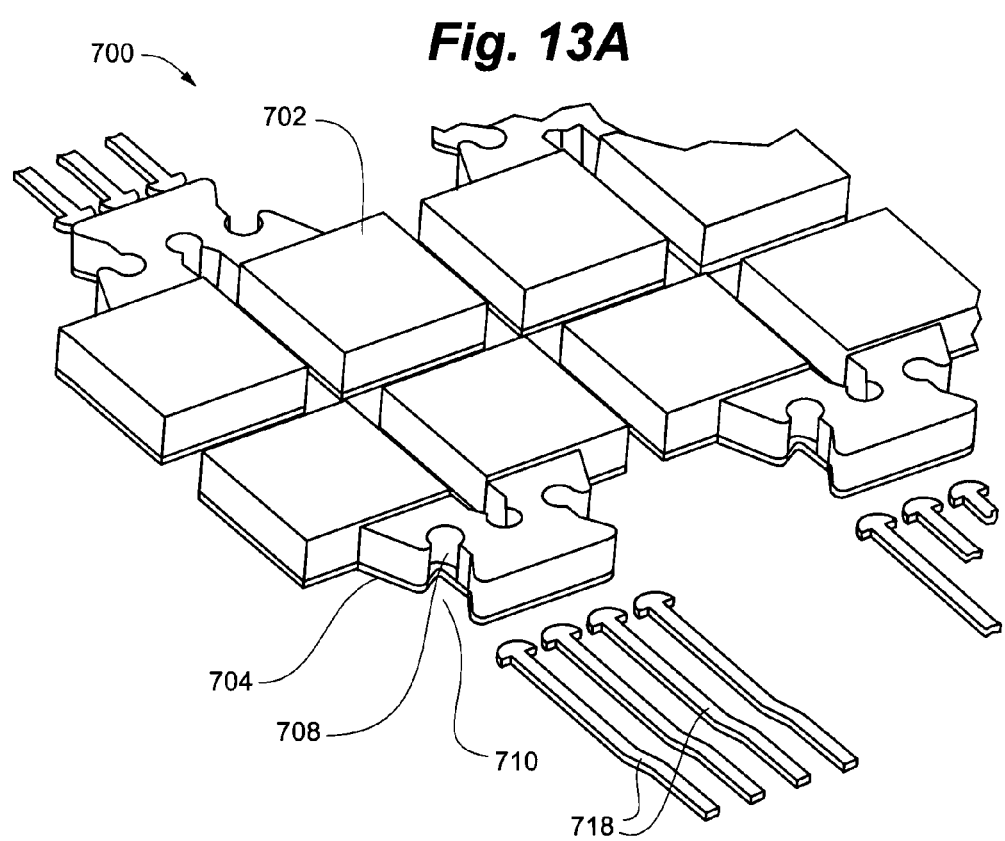
FIG. 13A depicts a perspective view of a first side of current sensors according to an embodiment.
Figure 13B:
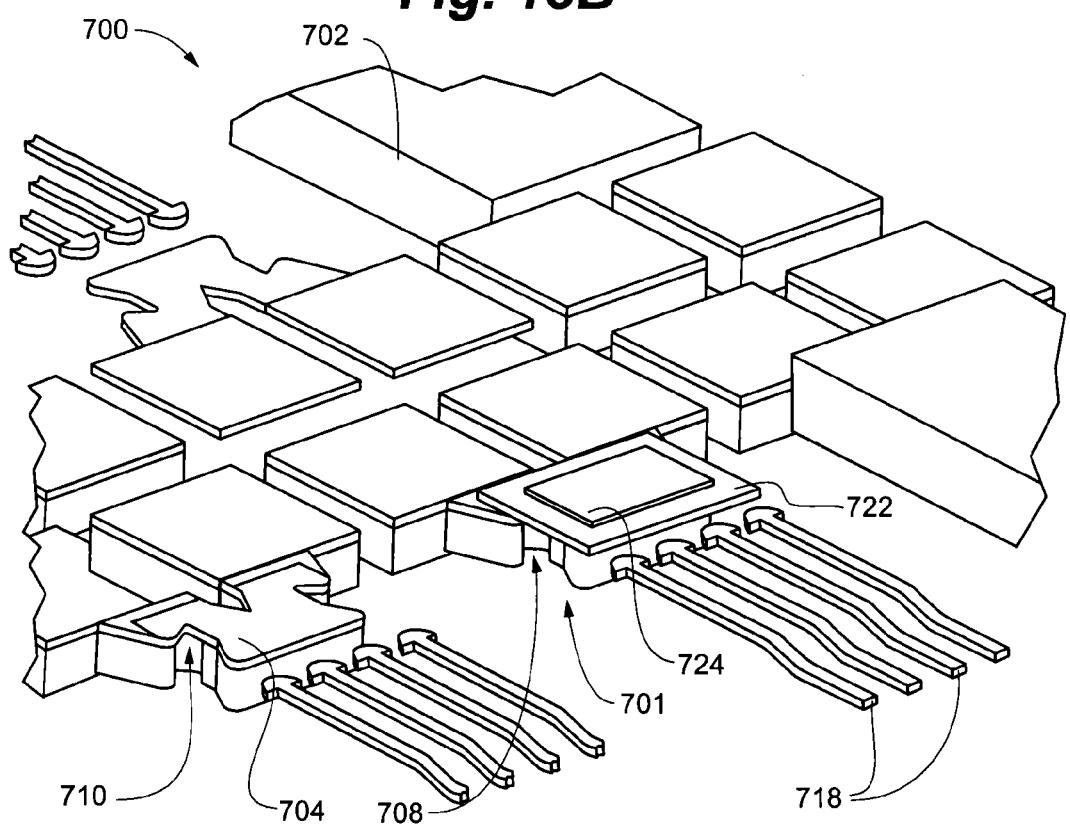
FIG. 13B depicts a perspective view of a second side of the current sensors of FIG. 13A.

Another embodiment is depicted in FIG. 13. FIG. 13A depicts stacking of thick layer 702 and thin layer 704 from a first side. Layer 704 has more pointed notches 710 and also serves for low voltage pins 718. FIG. 13B depicts layers 702 and 704 from another side. Device 701 in FIG. 13B further comprises an isolation platelet 722 and die 724. Die 724 can be contacted via bond wires to low voltage pins (not shown).

Figure 14A:
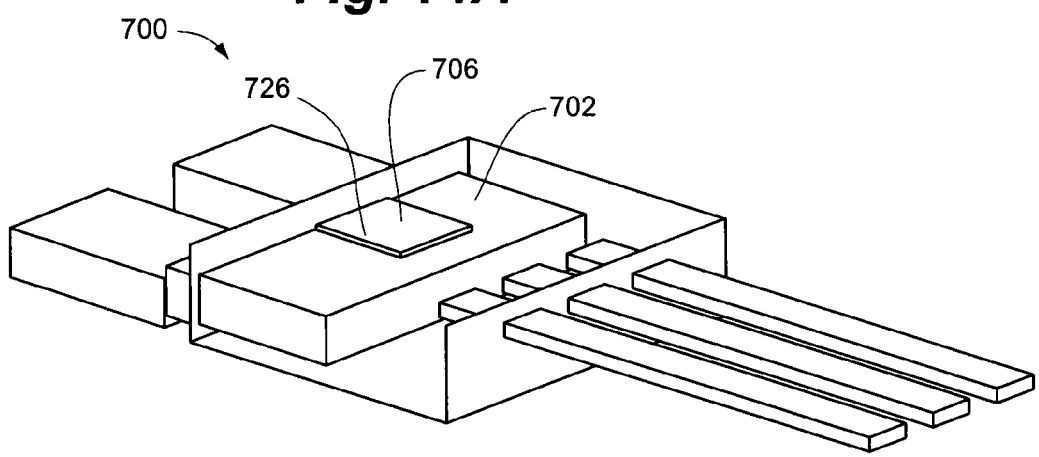
FIG. 14A depicts an opened mold body of current sensor according to an embodiment.
Figure 14B:
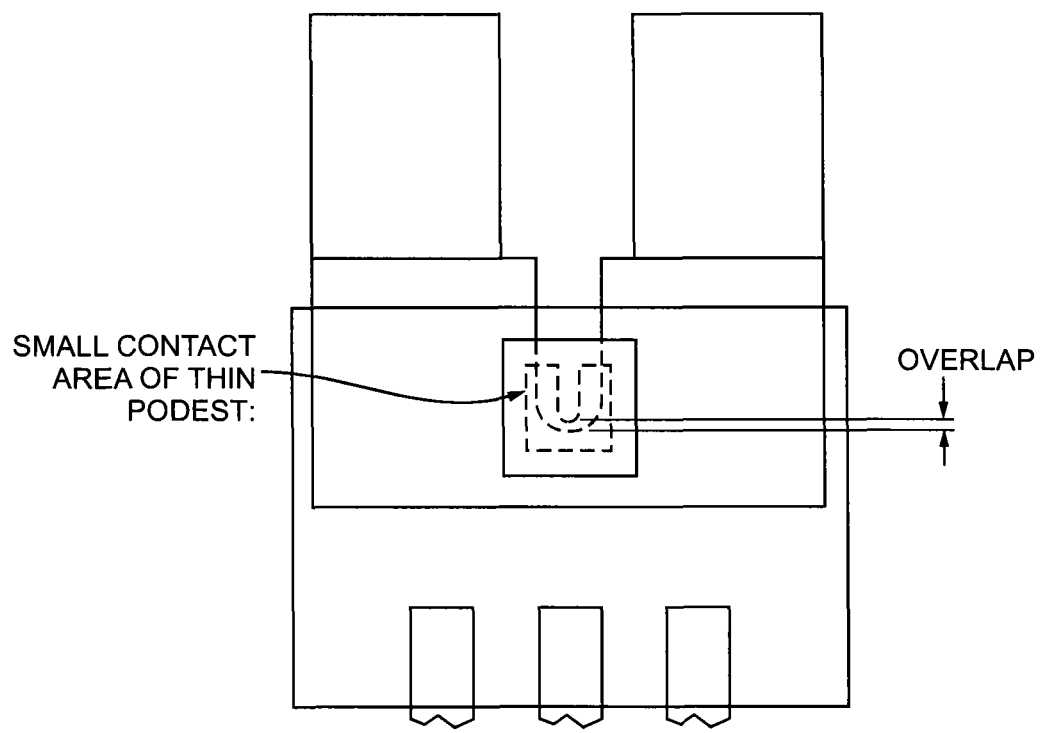
FIG. 14B depicts a top view diagram of the sensor of FIG. 14A.
Figure 14C:
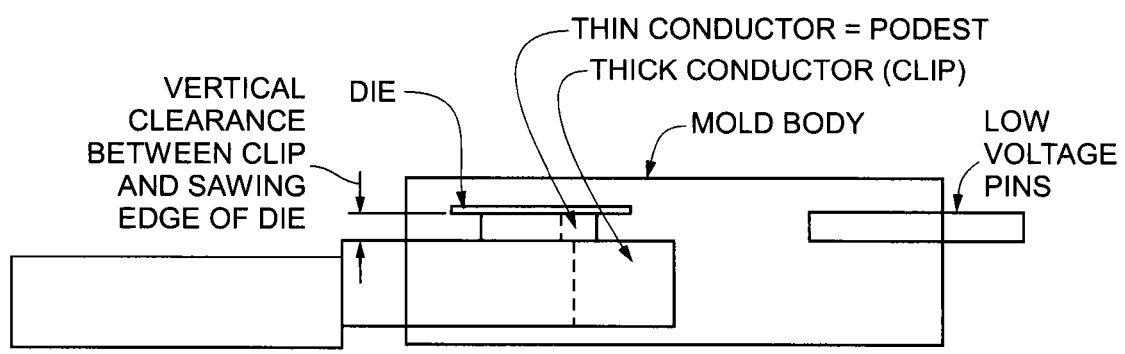
FIG. 14C depicts a side view diagram of the sensor of FIGS. 14A and 14B.

The stacking of a thin conductor onto a thicker layer or clip enables new ways of galvanic isolation. The thin conductor may act as a pedestal, on which rests the die. If the die is larger than the thin conductor, there is no crossing of the conductor across the sawing edge. Thus, if the thickness of the pedestal is large enough to provide a large enough creepage distance between the sawing edge of the die and the thick clip, the voltage isolation can be accomplished by a dielectric layer in an embodiment, which is produced on the top or bottom surface of the die during the front-end semiconductor manufacturing process. Such a configuration is cost-effective and provides high quality dielectric layers which achieve higher isolation voltages at lower thicknesses, which again increases the current sensitivity of the sensor. In FIG. 14A, the mold body is opened in order to show die 706 and pedestal 726. Additional views are depicted in FIGS. 14B and 14C.

Figure 15A:
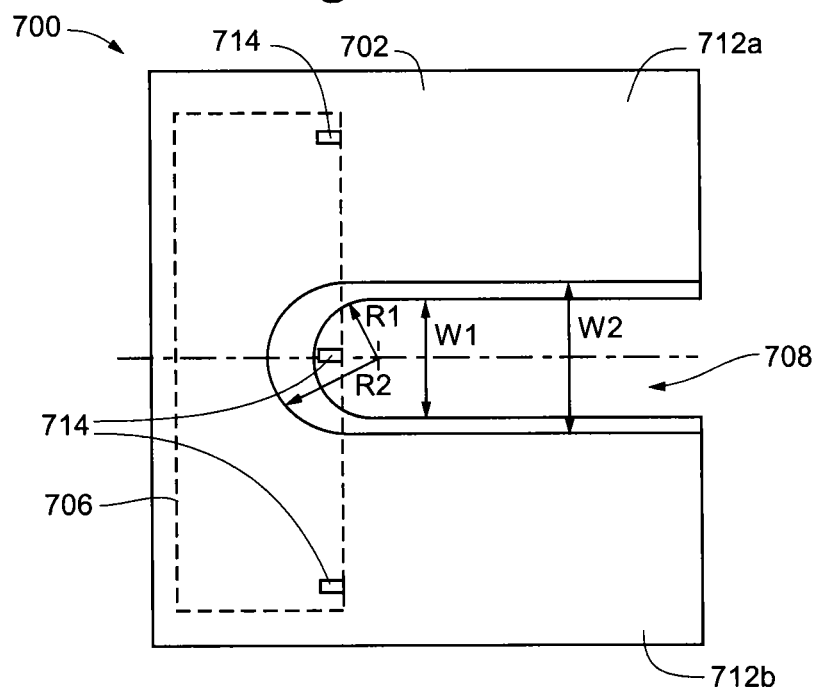
FIG. 15A depicts a top view of a current sensor according to an embodiment.
Figure 15B:
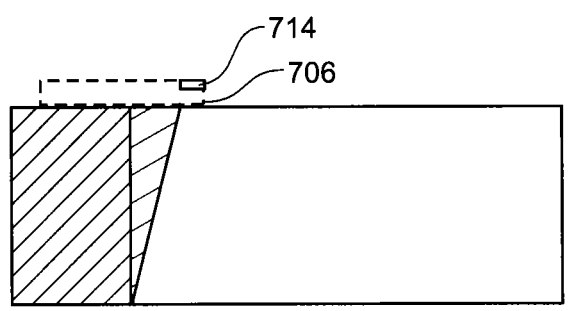
FIG. 15B depicts a cross-sectional view of the current sensor of FIG. 15A.

In yet another embodiment, a single thick sheet metal is processed in a way to obtain a similar structure, where a thin part provides a "shortcut" for the current around the notches and thus increases the current density adjacent the notch ends. Such a structure can be obtained by etching, because an etch process can result in conical holes/slots. In FIGS. 15A and 15B, the width of slot 708 on the side of sheet metal 702 closer to magnetic field sensor elements 714 is W1, which is smaller than the width of slot 708 on the opposite side of sheet metal 702 (W2). Also, the radius of curvature of the end of slot 708 on the first side of sheet metal 702 closer to magnetic field sensors 714 is R1, which is smaller than the radius of curvature of the end of slot 708 on the opposite side (R2). In general, therefore, an embodiment comprises a U-shaped conductor having a reduced thickness along an inner edge, without altering the outer edge. This has the effect in an embodiment of increasing the current density close to magnetic field sensor elements 714. Other configurations are possible in other embodiments, however.

In an embodiment, the metal layers depicted in FIGS. 15A and B can be separately manufactured and then joined together. The layers can be joined by a contact layer, such as solder, in an embodiment, or by an ultrasonic welding zone or some other means in other embodiments. In a solder-joined embodiment, sensor 700 can be generally designed such that a current density at maximum allowed current is less than about 20 A/mm$^2$ to prevent electromigration from causing the solder interface to disintegrate under the action of a high current. This can be accomplished in an embodiment by making the thin layer large so that the layer extends from the areas of extreme current density all the way to areas of lower current density (e.g., the contact regions of the conductor).

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic current sensor comprising:
a conductor comprising
a first sheet metal layer having a first thickness and compromising at least one notch extending, inwardly from a first edge of the first sheet metal layer, and
a second sheet metal layer having a second thickness less than the first thickness and comprising at least one notch, the second sheet metal layer being coupled to the first sheet metal layer such that the at least one notch of the first sheet metal layer is generally aligned with the at least one notch of the second sheet metal layer; and
an integrated circuit (IC) die comprising at least one magnetic sensor element and being coupled to the conductor such that the at least one magnetic sensor element is generally aligned with a tip of the at least one notch of the second sheet metal layer,
wherein a perimeter of the at least one notch of the second metal layer is generally contained within a perimeter of the at least one notch of the first metal layer such that the perimeters do not cross in tip regions of the notches.

2. The magnetic current sensor of claim 1, wherein the die is arranged adjacent the second sheet metal layer.

3. The magnetic current sensor of claim 1, wherein the at least one magnetic sensor element comprises a Hall effect sensor element.

4. The magnetic current sensor of claim 1, wherein a tip of at least one of the notches of the first sheet metal layer and the notch of the second sheet metal layer has a radius.

5. The magnetic current sensor of claim 4, wherein the tip of the notch of the first metal layer has a radius and the tip of the notch of the second metal layer is generally pointed.

6. The magnetic current sensor of claim 1, wherein the first thickness is about 0.3 millimeters (mm) to about 3 mm, and wherein the second thickness is about 0.1 mm to about 0.4 mm.

7. The magnetic current sensor of claim 1, wherein the conductor is generally U-shaped.

8. The magnetic current sensor of claim 1, wherein the conductor comprises two portions, each portion including a first sheet metal layer and a second sheet metal layer.

9. The magnetic current sensor of claim 1, further comprising a plurality of pins coupled to the die by bond wires.

10. The magnetic current sensor of claim 1, wherein the first sheet metal layer comprises at least three notches and the second sheet metal layer comprises at least three notches.

11. The magnetic current sensor of claim 1, further comprising an isolation platelet arranged between the second metal layer and the die.

12. The magnetic current sensor of claim 1, wherein the at least one magnetic sensor element comprises three sensor elements.

13. The magnetic current sensor element of claim 12, wherein the three sensor elements are linearly arranged and spaced apart, and wherein a center sensor element is generally aligned with a tip of the at least one notch of the second sheet metal layer.

14. A magnetic current sensor conductor comprising:
 a current input contact;
 a current output contact; and
 two electrically coupled layers electrically coupled with the current input contact and the current output contact, each layer comprising at least one notch, the at least one notch of the first layer and the at least one notch of the second layer arranged to define a minimum current path length in the conductor between the current input contact and the current output contact that is shorter than a minimum current path length in a thinner one of the two electrically coupled layers alone.

15. The magnetic current sensor of claim 14, further comprising an integrated circuit (IC) die comprising at least one magnetic sensor element and being coupled to the conductor, the at least one magnetic sensor element being generally positioned relative to a tip or one or more of the at least one notch of the two electrically coupled layers.

16. A magnetic current sensor comprising:
 a conductor comprising
  a first sheet metal layer having a first thickness and comprising at least one notch extending inwardly from a first edge of the first sheet metal layer, and
  a second sheet metal layer having a second thickness less than the first thickness and comprising at least one notch, the second sheet metal layer being coupled to the first sheet metal layer such that the at least one notch of the first sheet metal layer is generally aligned with the at least one notch of the second sheet metal layer, and
 an integrated circuit (IC) die comprising at least three magnetic sensor elements and being coupled to the conductor such that the at least three magnetic sensor elements are linearly arranged and spaced apart from one another and a first magnetic sensor element of the at least three magnetic sensor elements is arranged between second and third ones of the at least three magnetic sensor elements and is generally aligned with a tip of the at least one notch of the second sheet metal layer.

* * * * *

UNITED STATES PATENT AND TRADEMARK OFFICE
CERTIFICATE OF CORRECTION

| | | |
|---|---|---|
| PATENT NO. | : 8,760,149 B2 | Page 1 of 1 |
| APPLICATION NO. | : 12/756652 | |
| DATED | : June 24, 2014 | |
| INVENTOR(S) | : Ausserlechner | |

It is certified that error appears in the above-identified patent and that said Letters Patent is hereby corrected as shown below:

In The Specification

Column 9, Line 65, should read "Sensor elements 714a, 714b and 714c, such as planar Hall"
Column 11, Lines 52-53, replace FIGS. 15A and B with FIGS. 15A and 15B Signed and Sealed this
Twenty-eighth Day of April, 2015

Michelle K. Lee
*Director of the United States Patent and Trademark Office*